United States Patent
Dutta et al.

(10) Patent No.: US 10,833,257 B1
(45) Date of Patent: Nov. 10, 2020

(54) FORMATION OF EMBEDDED MAGNETIC RANDOM-ACCESS MEMORY DEVICES WITH MULTI-LEVEL BOTTOM ELECTRODE VIA CONTACTS

(71) Applicant: International Business Machines Corporation, Armonk, NY (US)

(72) Inventors: Ashim Dutta, Menands, NY (US); John C. Arnold, North Chatham, NY (US); Chih-Chao Yang, Glenmont, NY (US); Theodorus E. Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/401,960

(22) Filed: May 2, 2019

(51) Int. Cl.
*H01L 43/12* (2006.01)
*G11C 11/16* (2006.01)
(Continued)

(52) U.S. Cl.
CPC ............ *H01L 43/12* (2013.01); *G11C 11/161* (2013.01); *H01L 27/1222* (2013.01); *H01L 43/02* (2013.01)

(58) Field of Classification Search
None
See application file for complete search history.

(56) References Cited

U.S. PATENT DOCUMENTS 9,087,633 B2  7/2015 Khvalkovskiy et al.
9,595,662 B2  3/2017 Li et al.
(Continued)

FOREIGN PATENT DOCUMENTS

CN  104733561 A  6/2015
CN  108232009 A  6/2018
WO  2015094974 A1  6/2015

OTHER PUBLICATIONS

H. Honjo et al., "High Thermal Tolerance Synthetic Ferrimagnetic Reference Layer with Modified Buffer Layer by Ion Irradiation for Perpendicular Anisotrophy Magnetic Tunnel Junctions," IEEE International Magnetic Conference (INTERMAG), 2018, p. 1596.

(Continued)

*Primary Examiner* — Shaun M Campbell
(74) *Attorney, Agent, or Firm* — James Nock; Ryan, Mason & Lewis, LLP

(57) ABSTRACT

Techniques are provided for fabricating semiconductor integrated circuit devices with embedded magnetic random-access memory (MRAM) devices. For example, a MRAM device and a multi-level bottom electrode via contact are formed within a back-end-of line layer. The MRAM device includes a memory device pillar having a bottom electrode, a magnetic tunnel junction structure, and an upper electrode. The multi-level bottom electrode via contact is disposed below and in contact with the bottom electrode. The multi-level bottom electrode via contact includes a first via contact disposed in a first insulation layer, and a second via contact disposed in a second insulation layer. The first and second insulation layers allow for sacrificial etching of the first and second insulation layers during formation of the MRAM device while retaining a sufficient thickness of remaining insulation material to serve as a capping layer to protect metallic wiring that is disposed in an underlying metallization layer.

16 Claims, 10 Drawing Sheets

(51) Int. Cl.
  *H01L 43/02* (2006.01)
  *H01L 27/12* (2006.01)
  *H01L 27/22* (2006.01)

(56) References Cited

U.S. PATENT DOCUMENTS

| | | |
|---|---|---|
| 2004/0012056 A1 | 1/2004 | Nejad et al. |
| 2010/0311243 A1 | 12/2010 | Mao |
| 2012/0032287 A1 | 2/2012 | Li et al. |
| 2014/0042567 A1 | 2/2014 | Jung et al. |
| 2015/0171314 A1 | 6/2015 | Li et al. |
| 2016/0133828 A1 | 5/2016 | Lu et al. |
| 2018/0212140 A1 | 7/2018 | Noh |
| 2020/0035908 A1* | 1/2020 | Ku ................ H01L 43/02 |
| 2020/0083428 A1* | 3/2020 | Weng ............. H01L 43/02 |
| 2020/0106000 A1* | 4/2020 | Chiu .............. H01L 27/222 |
| 2020/0135805 A1* | 4/2020 | Hsu ............... H01L 27/228 |
| 2020/0136015 A1* | 4/2020 | Hung ............. H01L 21/76801 |
| 2020/0136027 A1* | 4/2020 | Wu ................ H01L 27/228 |

OTHER PUBLICATIONS

S. Lefadatu et al., "Heat-Assisted Multiferroic Solid-State Memory," Materials, Jul. 2017, 10 pages, vol. 10, No. 9.

O. Joubert et al., "An Etching Method," ip.com, IP.com No. IPCOM000199693D, Sep. 15, 2010, 26 pages.

\* cited by examiner

100

100

100

FORMATION OF EMBEDDED MAGNETIC RANDOM-ACCESS MEMORY DEVICES WITH MULTI-LEVEL BOTTOM ELECTRODE VIA CONTACTS

TECHNICAL FIELD

This disclosure relates generally to semiconductor fabrication techniques and, in particular, methods for fabricating embedded magnetic random-access memory (MRAM) devices.

BACKGROUND

Spin-transfer torque magnetic random-access memory (STT-MRAM) is a type of solid state, non-volatile memory that uses tunneling magnetoresistance (TMR) to store information. A MRAM system comprises an electrically connected array of magnetoresistive memory elements, referred to as magnetic tunnel junctions (MTJs). As is known in the art, a basic structure of a magnetic tunnel junction includes two thin ferromagnetic layers separated by a thin insulation layer through which electrons can tunnel. The spin-transfer torque (STT) phenomenon is realized in a MTJ structure, wherein one ferromagnetic layer (referred to as "magnetic free layer") has a non-fixed magnetization, and the other ferromagnetic layer (referred to as a "magnetic pinned layer", or "reference layer") has a "fixed" magnetization. A MTJ stores information by switching the magnetization state of the magnetic free layer. When the magnetization direction of the magnetic free layer is parallel to the magnetization direction of the reference layer, the MTJ is in a "low resistance" state. Conversely, when the magnetization direction of the free layer is antiparallel to the magnetization direction of the reference layer, the MTJ is in a "high resistance" state. A magnetic tunnel structure can be fabricated with multiple magnetic, conductive and/or insulting layers, depending on the given application. For example, additional stacked layers may include two or more magnetic layers and two or more tunnel barrier layers, and other layers that are commonly implemented to construct other types of magnetic tunnel junction structures, e.g., double magnetic tunnel junction structures.

Conventional methods for fabricating embedded MRAM devices can lead to degraded performance of MRAM devices. For example, conventional methods for fabricating MRAM devices typically utilize a single etch process to etch a MTJ layer stack and bottom electrode layer down to an underlying dielectric layer to thereby form a MTJ structure and bottom electrode. With this etch process, an over-etch is performed to properly pattern the bottom electrode layer, which results in gouging of the underlying dielectric layer. In this instance, residual metallic material is re-deposited on the sidewalls of the MTJ structure (as a result of the etching of the MTJ layer stack and the bottom electrode layer), and residual dielectric material is re-deposited over the residual metallic material on the sidewalls of the MTJ structure (as a result of the etching of the underlying dielectric layer). The residual metallic material that is re-deposited on the sidewalls of the MTJ structure can result in junction shorts between metallic/magnetic layers within the MTJ structure.

While a cleaning etch process can be utilized to clean the residual material from the sidewalls of the MTJ structures, the cleaning etch process can be problematic as it is difficult to remove the metallic residue from the sidewalls of the MTJ structure with the metallic residue covered by the dielectric residue from the etching of the underlying dielectric layer. As such, the cleaning etch process must be performed for relatively long period of time and at a relatively high power to effectively remove the residual metallic material from the sidewalls of the MTJ structure. However, the cleaning etch process leads to further etching/gouging of the exposed surface of the underlying dielectric layer, which can lead to removal of the dielectric material in open areas (e.g., non-memory areas) outside the MRAM array and exposing metallic wiring of a lower interconnect level of a BEOL structure.

SUMMARY

Embodiments of the invention include methods for fabricating semiconductor integrated circuit (IC) devices having embedded MRAM devices with multi-level bottom electrode via contacts. For example, in one exemplary embodiment, a first insulation layer is formed over a metallization layer of a substrate and a second insulation layer is formed over the first insulation layer. The first insulation layer comprises a first bottom electrode via contact, and the second insulation layer comprises a second bottom electrode via contact, wherein the second bottom electrode via contact is disposed over, and in contact with, the first bottom electrode via contact. A stack of layers is formed over the second insulation layer. The stack of layers comprises a bottom electrode layer formed over the second insulation layer, a magnetic tunnel junction layer stack formed over the bottom electrode layer, and an upper electrode layer formed over the magnetic tunnel junction layer stack. The stack of layers is etched to form a memory device pillar comprising a bottom electrode, a magnetic tunnel junction structure, and an upper electrode, wherein the bottom electrode is disposed over, and in contact with, the second bottom electrode via contact. The etching of the stack of layers results in recessing an exposed portion of the second insulation layer. A conformal layer of dielectric material is deposited and etched to thereby form a dielectric spacer on sidewalls of the memory device pillar. The etching of the conformal layer of dielectric material results in further recessing the exposed portion of the second insulation layer down to the first insulation layer. A remaining portion of the first insulation layer serves as a capping layer for the metallization layer.

In another exemplary embodiment, a method for fabricating a semiconductor integrated circuit device comprises forming a metallization layer of a back-end-of-line structure, wherein the metallization layer comprises a first interlayer dielectric layer and a plurality of metallic structures formed in the first interlayer dielectric layer in a memory region and a non-memory region of the back-end-of line structure. A first insulation layer is formed over the metallization layer, wherein the first insulation layer comprises a first bottom electrode via contact formed in the first insulation layer in the memory region. A second insulation layer is formed over the first insulation layer, wherein the second insulation layer comprises a second bottom electrode via contact formed in the second insulation layer in the memory region. The second bottom electrode via contact is disposed over, and in contact with, the first bottom electrode via contact. A stack of layers is formed over the second insulation layer, wherein the stack of layers comprises a bottom electrode layer formed over the second insulation layer, a magnetic tunnel junction layer stack formed over the bottom electrode layer, and an upper electrode layer formed over the magnetic tunnel junction layer stack. The stack of layers is etched to form a memory device pillar comprising a bottom electrode, a magnetic tunnel junction structure, and an upper electrode.

The bottom electrode is disposed over, and in contact with, the second bottom electrode via contact. The etching the stack of layers results in recessing an exposed portion of the second insulation layer. A conformal layer of dielectric material is deposited and etched to thereby form a dielectric spacer on sidewalls of the memory device pillar. The etching of the conformal layer of dielectric material results in further recessing of the exposed portion of the second insulation layer down to the first insulation layer, and partially recessing an exposed portion of the first insulation layer. The partially recessed first insulation layer serves as a capping layer for the metallization layer. A second interlayer dielectric layer is formed to cover the partially recessed first insulation layer and the memory device pillar in the non-memory and memory regions of the back-end-of-line structure. Metallic interconnect structures are formed in the second interlayer dielectric layer, wherein the metallic interconnect structures comprise an upper electrode via contact which is formed in contact with the upper electrode of the memory device pillar in the memory region of the back-end-of-line structure.

Another exemplary embodiment includes a semiconductor integrated circuit device. The device comprises a magnetic random-access memory device disposed within a memory region of a back-end-of line layer, and a multi-level bottom electrode via contact. The magnetic random-access memory device comprises a memory device pillar and an insulating spacer disposed on sidewalls of the memory device pillar. The memory device pillar comprises a bottom electrode, a magnetic tunnel junction structure disposed on the bottom electrode, and an upper electrode disposed on the magnetic tunnel junction structure. The multi-level bottom electrode via contact is disposed below and in contact with the bottom electrode of the memory device pillar. The multi-level bottom electrode via contact comprises a first bottom electrode via contact disposed in a first insulation layer, and a second bottom electrode via contact disposed in a second insulation layer.

Other embodiments will be described in the following detailed description of embodiments, which is to be read in conjunction with the accompanying figures.

BRIEF DESCRIPTION OF THE DRAWINGS

FIGS. 2 through 10 schematically illustrate a process for fabricating the semiconductor IC device of FIG. 1 having embedded MRAM devices with multi-level bottom electrode via contacts, according to an embodiment of the invention, wherein:

FIG. 2 is a schematic cross-sectional side view of the semiconductor IC device at an intermediate stage of fabrication in which a plurality of metallic structures are formed in first and second insulation layers in a memory region and a non-memory region of the semiconductor IC device;

FIG. 3 is a schematic cross-sectional side view of the semiconductor IC device shown in FIG. 2 after forming a third insulation layer, and after forming a first bottom electrode via contact in the third insulation layer in the memory region;

FIG. 4 is a schematic cross-sectional side view of the semiconductor IC device shown in FIG. 3 after forming a fourth insulation layer, and after forming a second bottom electrode via contact in the fourth insulation layer in the memory region, wherein the second bottom electrode via contact is disposed over the first bottom electrode via contact to form a multi-level bottom electrode via contact;

FIG. 5 is a schematic cross-sectional side view of the semiconductor IC device shown in FIG. 4 after sequentially forming a bottom electrode layer, a MTJ layer stack, an upper electrode layer, and a lithographic stack;

FIG. 6 is a schematic cross-sectional side view of the semiconductor IC device shown in FIG. 5 after performing dry etch processes to pattern a hardmask layer of the lithographic stack, and the upper electrode layer to form a hardmask capping layer and an upper electrode of an MRAM device;

FIG. 7 is a schematic cross-sectional side view of the semiconductor IC device shown in FIG. 6 after patterning exposed portions of the MTJ layer stack and the bottom electrode layer to form a MTJ structure and bottom electrode of the MRAM device;

FIG. 8 is a schematic cross-sectional side view of the semiconductor IC device shown in FIG. 7 after forming a conformal dielectric layer that encapsulates the MRAM device;

FIG. 9 is a schematic cross-sectional side view of the semiconductor IC device shown in FIG. 8 after patterning the conformal dielectric layer to form dielectric sidewall spacers on sidewalls of the MRAM device; and FIG. 10 is a schematic cross-sectional side view of the semiconductor IC device shown in FIG. 9 after forming a fifth insulation layer in the non-memory and memory regions which encapsulates the MRAM device.

DETAILED DESCRIPTION

Figure 1:
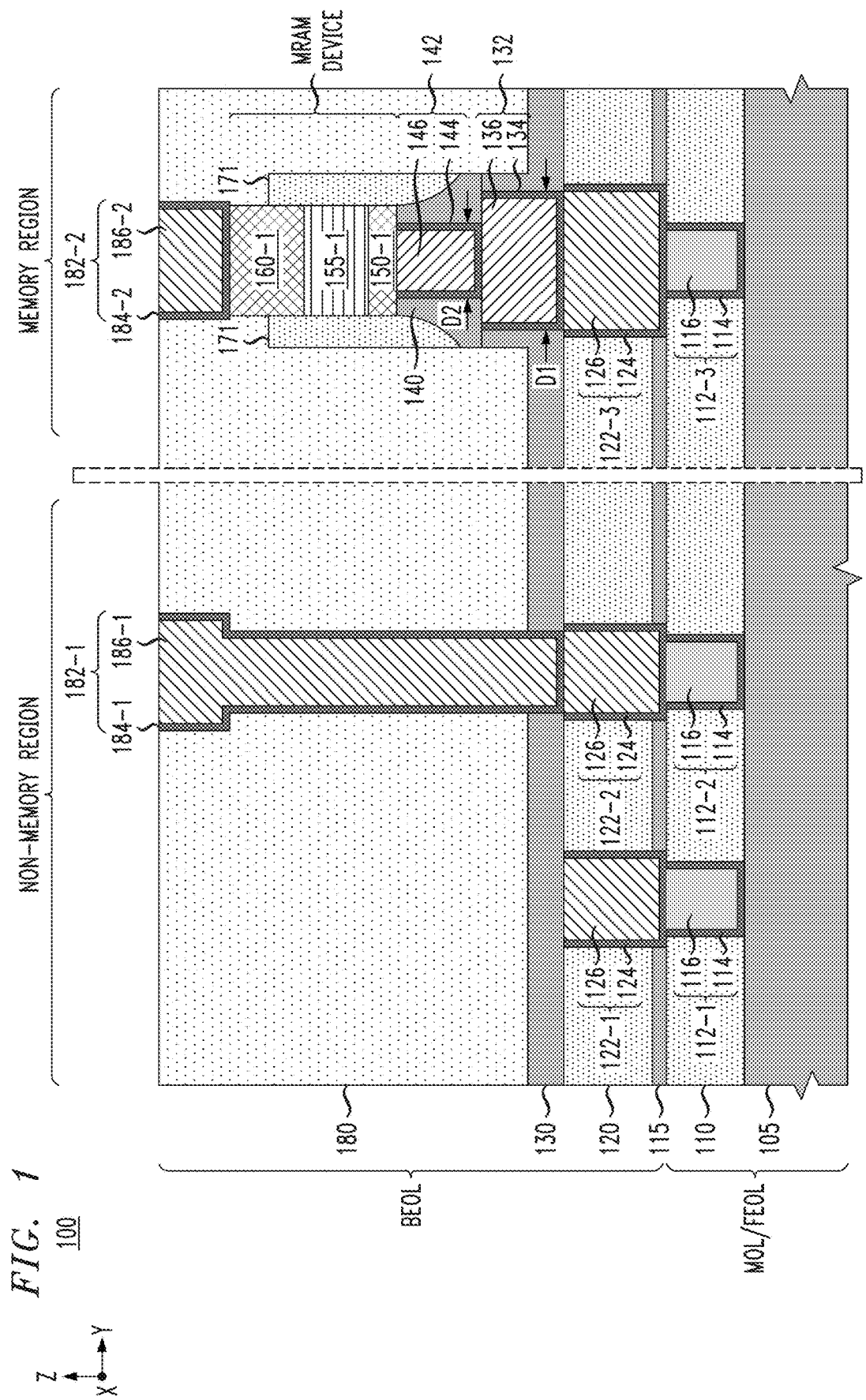
FIG. 1 is a schematic is a schematic cross-sectional side view of a semiconductor integrated circuit (IC) device which comprises embedded MRAM devices with multi-level bottom electrode via contacts, according to an embodiment of the invention.

Embodiments of the invention will now be described in further detail with regard to methods for fabricating semiconductor IC devices having embedded MRAM devices with multi-level bottom electrode via contacts. As explained in further detail below, the multi-level bottom electrode via contacts are formed in multiple layers of dielectric capping material, which allows sacrificial etching of the dielectric capping layers during formation of the MRAM devices (e.g. etch patterning and etch cleaning steps) while retaining a sufficient thickness of a remaining dielectric material to serve as a protective capping layer to protect metallic wiring and other metallization disposed in an underlying metallization layer. For purposes of illustration, exemplary embodiments of the invention will be discussed in the context of fabricating embedded MRAM devices within a back-end-of-line (BEOL) structure of a semiconductor IC device, although the exemplary fabrication techniques discussed herein can be utilized for fabricating embedded MRAM devices in other layers (e.g., middle-of-line layer) of a semiconductor IC device.

It is to be understood that the various layers, structures, and regions shown in the accompanying drawings are schematic illustrations that are not drawn to scale. In addition, for ease of explanation, one or more layers, structures, and regions of a type commonly used to form semiconductor IC devices or structures may not be explicitly shown in a given drawing. This does not imply that any layers, structures, and regions not explicitly shown are omitted from the actual semiconductor IC device structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor IC devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

The term "exemplary" as used herein means "serving as an example, instance, or illustration". Any embodiment or design described herein as "exemplary" is not to be construed as preferred or advantageous over other embodiments or designs. The word "over" as used herein to describe forming a feature (e.g., a layer) "over" a side or surface, means that the feature (e.g. the layer) may be formed "directly on" (i.e., in direct contact with) the implied side or surface, or that the feature (e.g., the layer) may be formed "indirectly on" the implied side or surface with one or more additional layers disposed between the feature (e.g., the layer) and the implied side or surface.

To provide spatial context to the different structural orientations of the semiconductor IC device structures shown throughout the drawings, XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

FIG. 1 is a schematic is a schematic cross-sectional side view of a semiconductor integrated IC device 100 which comprises embedded MRAM devices with multi-level bottom electrode via contacts, according to an embodiment of the invention. The semiconductor IC device 100 comprises a front-end-of-line/middle-of-line (FEOL/MOL) structure comprising a substrate 105, a first insulation layer 110, a plurality of device contacts 112-1, 112-2, and 112-3 (collectively referred to as device contacts 112) formed in the first insulation layer 110. The semiconductor IC device 100 comprises a BEOL structure comprising a dielectric capping layer 115, a second insulation layer 120, and a plurality of metallic structures 122-1, 122-2, and 122-3, such as metallic wiring, vertical vias, etc. (collectively referred to as metallic structures 122) formed in the second insulting layer 120, a third insulation layer 130, a first bottom electrode via contact 132 formed in the third insulation layer 130, a fourth insulation layer 140, and a second bottom electrode via contact 142 formed in the fourth insulation layer 140.

The semiconductor IC device 100 further comprises an array of MRAM devices that is formed in a memory region of the BEOL structure. For ease of illustration, FIG. 1 illustrates one MRAM device of a MRAM array, wherein the MRAM device comprises a bottom electrode 150-1, a MTJ structure 155-1, and an upper electrode 160-1, wherein the MTJ structure 155-1 is disposed between the bottom and upper electrodes 150-1 and 160-1. The MRAM device further comprises a dielectric sidewall spacer 171 (or insulating spacer) which surrounds the sidewalls of the MTJ structure 155-1, the bottom electrode 150-1 and at least a portion of the upper electrode 160-1. The bottom electrode 150-1 is formed in contact with the second bottom electrode via contacts 142.

The BEOL structure further comprises a fifth insulation layer 180 and a plurality of metallic structures 182-1 and 182-2 formed in the fifth insulation layer 180. The fifth insulation layer 180 comprises an ILD layer of the BEOL structure which encapsulates the MRAM devices The metallic structure 182-1 comprises a metallic interconnect structure (e.g., wire and via structure) that is formed in contact with the metallic wire 122-2 in the underlying metallization layer of the BEOL structure. The metallic structure 182-2 comprises an upper electrode via contact that is formed in contact with the upper electrode 160-1 of the MRAM device.

In the exemplary embodiment of FIG. 1, the first and second bottom electrode via contacts 132 and 142 form a multi-level bottom electrode via contact structure that provides an electrical connection between the MRAM device and the underlying metallic structure wire 122-3 in the second insulation layer 120. As explained in further detail below, the multi-level bottom electrode via contact structure is disposed in multiple insulation layers, e.g., the third and fourth insulation layers 130 and 140, which collectively provide a relatively thick initial layer of dielectric material that is exposed to the sequence of etch processes that are performed to (i) pattern a stack of layers (e.g., electrode layers and a MTJ layer stack) to form the individual MRAM devices within the memory region, and (ii) clean residual metallic and dielectric materials from the sidewalls of the MTJ structures (e.g. MTJ structure 155-1) following the patterning of the individual MRAM devices, while allowing a sufficient residual thickness of dielectric material (e.g., remaining insulation layer 130 shown in FIG. 1) to remain in the non-memory region of the BEOL structure to protect the underlying metallic structures 122-1 and 122-2 in the non-memory region following such etch processes.

In the exemplary embodiment of FIG. 1, the first bottom electrode via contact 132 is formed with a first diameter D1, and the second bottom electrode via contact 142 is formed with a second diameter D2. In some embodiments, as schematically illustrated in FIG. 1, the first diameter D1 is greater than the second diameter D2. In other exemplary embodiments, the first and second diameters D1 and D2 are the same or substantially similar. In a preferred embodiment, the second diameter D2 of the second bottom electrode via contact 142 is less than a diameter of the MRAM layer stack (e.g., bottom electrode 150-1, MTJ structure 155-1, and upper electrode 160-1) which forms the MRAM device. As explained in further detail below, the MRAM layer stack is patterned to have a diameter which is greater than the second diameter D2 of the second bottom electrode via contact 142 so that the upper surface of the second bottom electrode via contact 142 is not etched/recessed as a result of the etch process (e.g., ion beam etch (IBE)) process that is used to pattern the stack of layers (e.g., electrode layers and a MTJ layer stack) to form the MRAM device.

Figure 2:
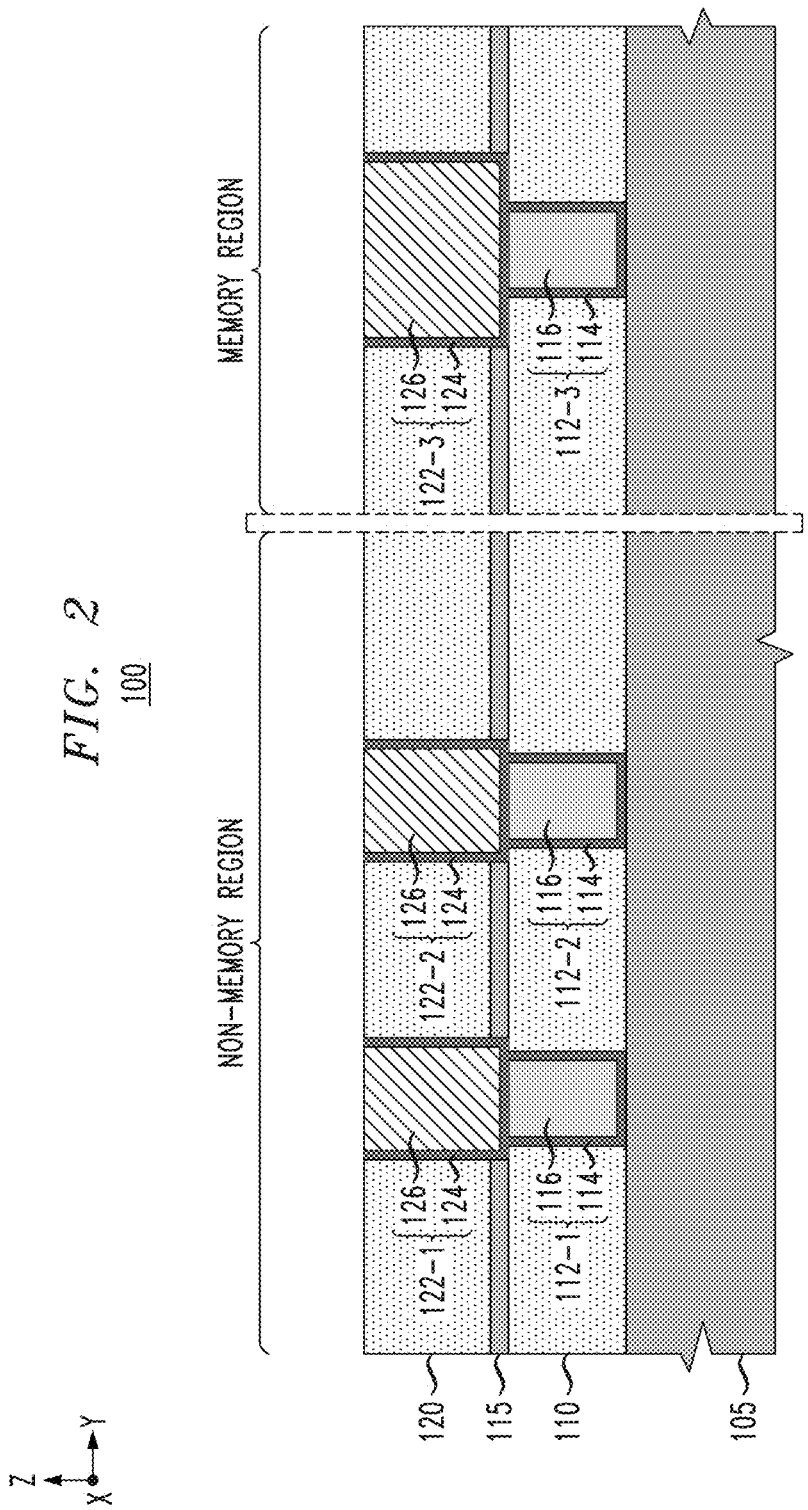

FIGS. 2 through 10 schematically illustrate a process for fabricating a semiconductor IC device having embedded MRAM devices with multi-level bottom electrode via contacts, according to an embodiment of the invention. For purposes of illustration, FIGS. 2 through 10 schematically illustrate a process flow for fabricating the semiconductor IC device 100 of FIG. 1 having embedded MRAM devices with multi-level bottom electrode via contacts. FIG. 2 is a schematic cross-sectional side view of the semiconductor IC device 100 at an intermediate stage of fabrication in which a plurality of metallic structures are formed in insulation layers in a memory region and a non-memory region of the semiconductor IC device 100, according to an embodiment of the invention.

In particular, FIG. 2 schematically illustrates the semiconductor IC device 100 at an initial stage of fabrication in which the first insulation layer 110 is formed over the substrate 105, the plurality of device contacts 112-1, 112-2, and 112-3 are formed in the first insulation layer 110, the dielectric capping layer 115 is formed over the first insulation layer 110, the second insulation layer 120 is formed over the dielectric capping layer 115, and the metallic structures 122-1, 122-2, and 122-3 are formed in the second insulation layer 120. It is to be noted that in each drawing of FIGS. 1-10, the X-Y plane represents a plane that is parallel to the plane of the substrate 105 being processed. The intermediate device structure shown in FIG. 2 can be fabricated using known materials and techniques.

For example, while the substrate 105 is generically depicted for ease of illustration, it is to be understood that the substrate 105 comprises multiple layers including a semiconductor wafer substrate, a FEOL layer formed on the semiconductor wafer substrate, and at least a portion of a MOL layer formed on the FEOL layer. The semiconductor wafer substrate comprises one of different types of semiconductor wafer substrate structures and materials. For example, in one embodiment, the semiconductor wafer substrate can be a bulk semiconductor wafer substrate that is formed of silicon (Si) or germanium (Ge), or other types of semiconductor substrate materials which are commonly used in bulk semiconductor fabrication processes such as a silicon-germanium alloy, compound semiconductor materials (e.g. III-V), etc. In another embodiment, the semiconductor wafer substrate may comprise an SOI (silicon-on-insulator) substrate, GeOI (germanium-on-insulator) substrate, or other types of semiconductor-on-insulator substrates which comprise an insulation layer (e.g., oxide layer) disposed between a base substrate layer (e.g., silicon substrate) and the active semiconductor layer (e.g., Si, Ge, etc.) in which active circuit components are formed as part of the FEOL.

The FEOL layer comprises various semiconductor devices and components that are formed in or on an active surface of the semiconductor wafer substrate to provide integrated circuitry for a target application, e.g., provide memory controller circuitry for controlling an array of MRAM devices formed in the memory region in the BEOL layer. For example, the FEOL layer comprises field-effect transistor (FET) devices (such as FinFET devices, vertical FET devices, planar FET devices, etc.), bipolar transistors, diodes, capacitors, inductors, resistors, isolation devices, etc., which are formed in or on the active surface of the semiconductor wafer substrate. In general, FEOL processes typically include preparing the semiconductor wafer substrate, forming isolation structures (e.g., shallow trench isolation), forming device wells, patterning gate structures, forming spacers, forming source/drain regions (e.g., via implantation), forming silicide contacts on the source/drain regions, forming stress liners, etc. The MOL layer comprises a PMD (pre-metal dielectric layer) and conductive contacts (e.g., source/drain contacts, gate contacts, etc.) that are formed in the PMD layer. The PMD layer is formed on the components and devices of the FEOL layer. The conductive contacts of the MOL layer provide electrical connections between the integrated circuitry of the FEOL layer and a first level of metallization of a BEOL structure that is formed over the FEOL/MOL layers.

In the exemplary embodiment of FIG. 1, it is assumed for illustrative purposes that the first insulation layer 110 is formed as part of an MOL layer and that the device contacts 112-1, 112-2, and 112-3 comprise vertical via contacts that provide contacts between devices in the FEOL layer and metal wiring in the BEOL layer. The first insulation layer 110 can be formed of a dielectric material including, but not limited to, silicon oxide (e.g. $SiO_2$), silicon nitride (e.g., $Si_3N_4$), a hybrid silica-based low-k dielectric material such as carbon-doped silicon glass (e.g., carbon-doped silicon glass (SiCOH) or organosilicate glass (SOG)), SiCH, SiCNH, etc.), a fluorinated silicon glass (FSG), a low-k porous dielectric material (k less than about 3.9), or an ULK (ultra-low-k) dielectric material (with k less than about 2.5 etc.), wherein "k" denotes a relative dielectric constant. The first insulation layer 110 may be formed using known deposition techniques, such as, for example, ALD (atomic layer deposition), CVD (chemical vapor deposition) PECVD (plasma-enhanced CVD), or PVD (physical vapor deposition), or spin-on deposition, or other deposition techniques that are suitable to form low-k or medium-k dielectric layers for MOL layers.

In some embodiments, the device contacts 112 comprise MOL device contacts (e.g., vertical source/drain via contacts, vertical gate contacts, etc.) which provide contact between devices (e.g., FET devices) in the FEOL layer and the metallic structures 122 (e.g., metallic wiring, interlayer vias, etc.) in the first BEOL metal level. The MOL device contacts 112 are formed using known methods and materials. For example, the MOL device contacts 112 can be formed by a process which comprises etching contact openings in the first insulation layer 110, lining the contact openings with a liner layer 114, filling the contact openings with a metallic material 116, and performing a chemical-mechanical polishing (CMP) process to remove overburden metallic and liner materials on the upper surface of the first insulation layer 110. In some embodiments, the liner layers 114 comprises one or more diffusion barrier layers (e.g., titanium and/or titanium nitride) and seed layers. In some embodiments, the metallic material 116 comprises tungsten, cobalt, ruthenium, etc., and other suitable metallic materials for MOL device contacts.

The capping layer 115 is formed by depositing a layer of dielectric material over the planarized surface of the first insulation layer 110. The capping layer 115 comprises a dielectric material which prevents diffusion/electromigration of metallic material from the MOL device contacts 112 into the second insulation layer 120. The capping layer 115 can be formed of dielectric materials such as silicon nitride (SiN), silicon boron carbon nitride (SiBCN), silicon carbide (SiC), nitrogen-doped SiC (e.g., silicon carbonitride (SiCN)), hydrogen-doped SiC (e.g., amorphous silicon carbon hydrogen (a-Si:C:H)), and other types of dielectric materials commonly used to form capping layers in MOL/BEOL layers.

In the exemplary embodiment of FIG. 2, it is assumed for illustrative purposes that the second insulation layer 120 comprises an ILD layer that is formed as part of a first metallization level of the BEOL structure. The second insulation layer 120 can be formed using the same or similar materials and methods as the first insulation layer 110, as discussed above. The metallic structures 122 are formed as part of, e.g., the first metallization layer of the BEOL structure, wherein the metallic structures 122 may comprise metal wiring and vias, etc. The metallic structures 122 can be formed by a process which comprises etching openings (e.g., trenches, vias, etc.) in the second insulation layer 120, lining the etched openings with a liner layer 124, filling the etched openings with a metallic material 126, and performing a CMP process to remove overburden metallic and liner materials on the upper surface of the second insulation layer 120.

In some embodiments, the liner layers 124 comprise one or more diffusion barrier layers that are commonly used for copper interconnects including, but not limited to, titanium, tantalum, titanium nitride, tantalum nitride, cobalt, etc. In addition, the liner layers 124 may comprise a thin seed layer which serves as a wetting or adhesion layer for the metallic material 126 which is deposited to fill the etched openings and form the metallic structures 122. In one embodiment, the metallic material 126 comprises copper, which is deposited using any suitable copper deposition method. The layer of metallic material can be deposited using any suitable wet or dry deposition method.

Figure 3:
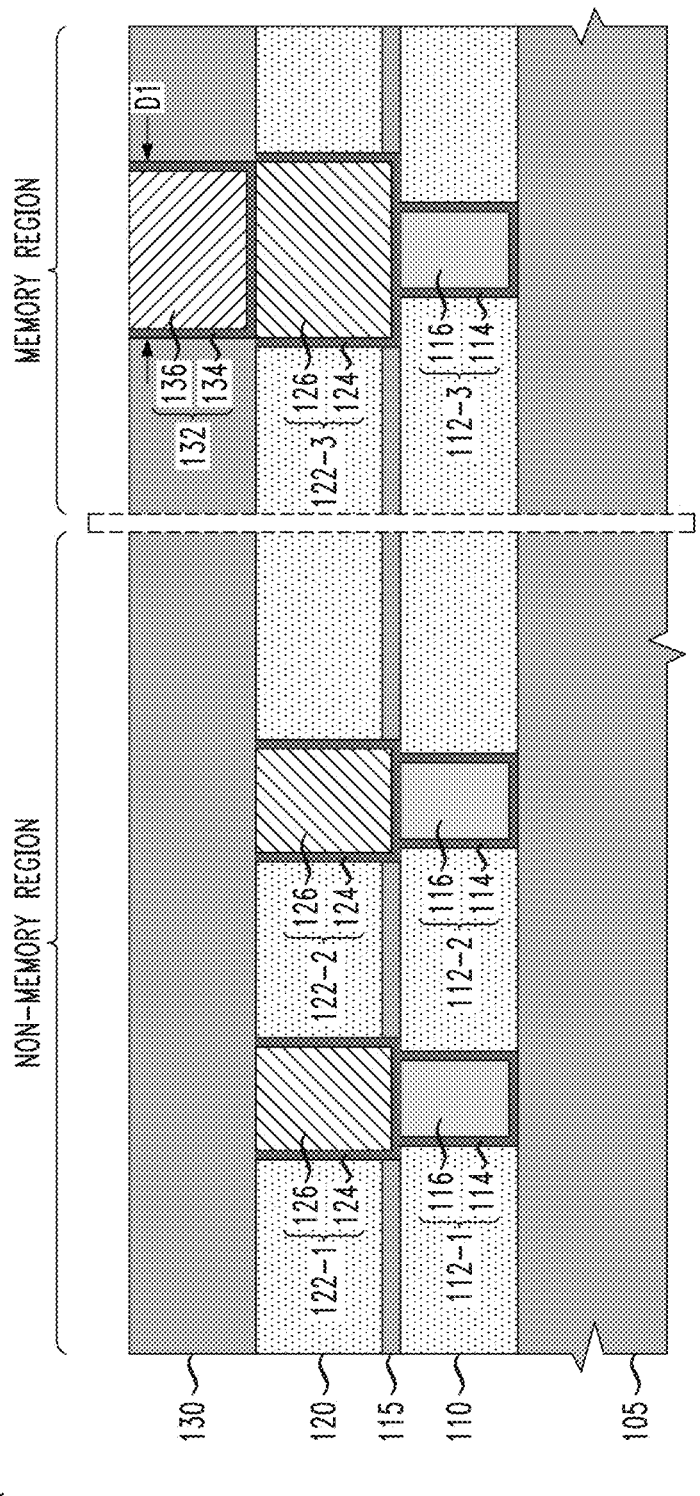

Next, FIG. 3 is a schematic cross-sectional side view of the device shown in FIG. 2 after forming the third insulation layer 130, and after forming the first bottom electrode via contact 132 in the third insulation layer 130 in the memory region of the BEOL structure. In some embodiments, the third insulation layer 130 is formed by depositing a layer of dielectric material such as SiO, SiN, SiBCN, SiC, SiCN, SiCH, or other types of dielectric material which are suitable for the given application. The thickness of the third insulation layer 130 defines the vertical height of the first bottom electrode via contact 132 that is formed in the third insulation layer 130. For example, in some exemplary embodiments, the third insulation layer 130 is formed with a thickness in a range of about 50 nm to about 150 nm.

The first bottom electrode via contact 132 comprises a liner layer 134 and a metallic via 136. The metallic via 136 can be formed of a metallic material such as tantalum, tantalum nitride, titanium, titanium nitride, copper, ruthenium, tungsten, etc., or other types of metallic material which are suitable for the given application. The liner layer 134 can be formed using one more layers of material that serve as a diffusion barrier layer and/or seed layer, such as titanium nitride, tantalum nitride, cobalt, ruthenium, etc. In some embodiments, the first bottom electrode via contact 132 is formed with a first diameter D1 in a range of about 50 nm to about 150 nm.

Figure 4:
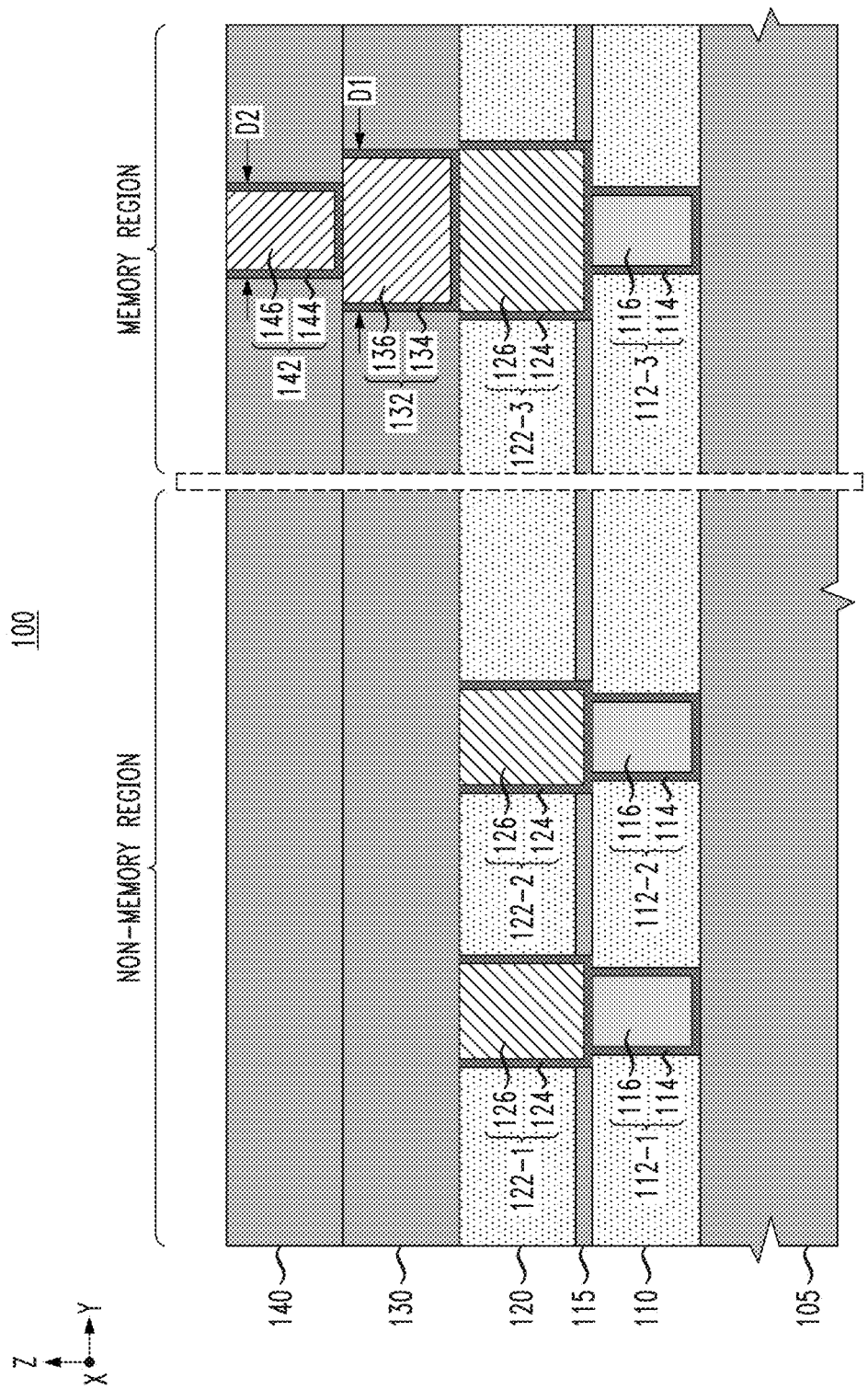

Next, FIG. 4 is a schematic cross-sectional side view of the device shown in FIG. 3 after forming the fourth insulation layer 140, and after forming the second bottom electrode via contact 142 in the fourth insulation layer 140 in the memory region of the BEOL structure. In this exemplary embodiment, the second bottom electrode via contact 142 is disposed over the first bottom electrode via contact 132 to form a multi-level bottom electrode via contact for an MRAM device. In some embodiments, the fourth insulation layer 140 is formed by depositing a layer of dielectric material such as SiO, SiN, SiBCN, SiC, SiCN, SiCH, or other types of dielectric material which are suitable for the given application. In some embodiments, the fourth insulation layer 140 is formed of the same dielectric material as the third insulation layer 130. The thickness of the fourth insulation layer 140 defines the vertical height of the second bottom electrode via contact 142 that is formed in the fourth insulation layer 140. For example, in some exemplary embodiments, the fourth insulation layer 140 is formed with a thickness in a range of about 50 nm to about 150 nm.

The second bottom electrode via contact 142 comprises a liner layer 144 and a metallic via 146. The metallic via 146 can be formed of a metallic material such as tantalum, tantalum nitride, titanium, titanium nitride, copper, ruthenium, tungsten, etc., or other types of metallic material which are suitable for the given application. The liner layer 144 can be formed using one more layers of material that serve as a diffusion barrier layer and/or seed layer, such as titanium nitride, tantalum nitride, cobalt, ruthenium, etc. As noted above, in some embodiments, the second bottom electrode via contact 142 is formed with a second diameter D2, which is less than the first diameter D1 of the first bottom electrode via contact 132. The second bottom electrode via contact 142 is formed with a diameter D2 in range of about 50 nm to about 150 nm.

Figure 5:
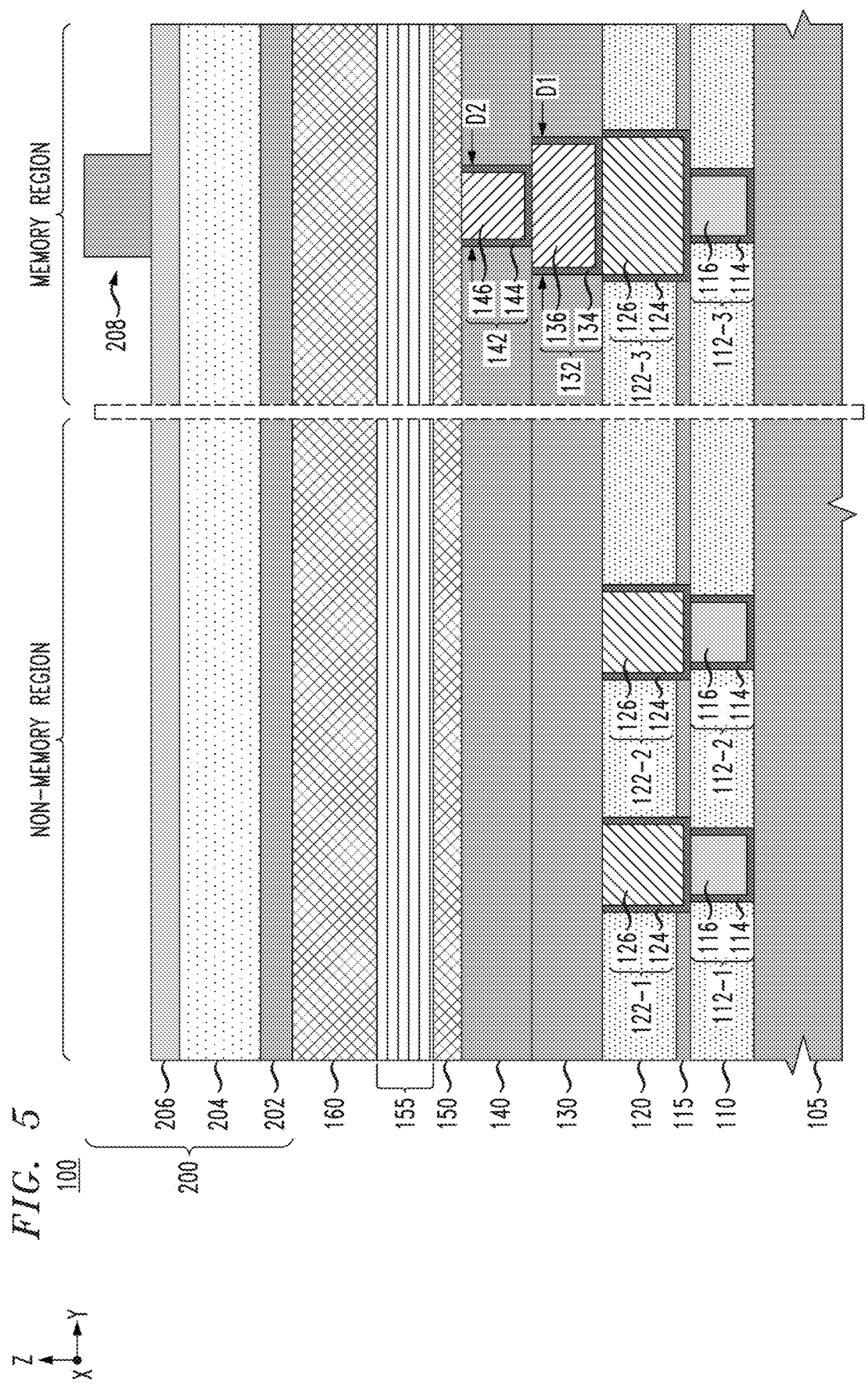

Next, FIG. 5 is a schematic cross-sectional side view of the device shown in FIG. 4 after sequentially forming a bottom electrode layer 150, a MTJ layer stack 155, an upper electrode layer 160, and a lithographic stack 200. The lithographic stack 200 comprises a hardmask layer 202, a planarizing layer 204, an anti-reflection coating (ARC) 206, and a patterned photoresist layer 208. The bottom electrode layer 150, the MTJ layer stack 155, and the upper electrode layer 160 are patterned to form individual MRAM devices in the memory region of the BEOL structure, wherein each MRAM device comprises a MTJ structure disposed between upper and lower electrodes. The bottom electrode layer 150 and the upper electrode layer 160 can be formed of the same or similar materials that are used to form the first and second bottom electrode via contacts 132 and 142. For example, the bottom electrode layer 150 and the upper electrode layer 160 can be formed by depositing a layer of metallic material such as TaN, TiN, W, or other types of metallic material which are suitable for use as electrodes for MRAM devices. In some exemplary embodiments, the bottom electrode layer 150 is formed with a thickness in range of about 5 nm to about 50 nm, and the upper electrode layer 160 is formed with a thickness in a range of about 100 nm to about 200 nm.

The MTJ layer stack 155 is formed of a plurality of metallic and insulation layers which form, e.g., magnetic pinned layer(s), magnetic free layer(s), tunnel barrier layer(s), etc., depending on the MTJ structure that is used to implement MRAM devices. For example, a magnetic pinned layer may comprise a layer of magnetic material such as cobalt (Co), iron (Fe), boron (B), or any combination thereof (e.g., CoFeB or CoFe). A tunnel barrier layer may comprise a non-magnetic, insulating material such as magnesium oxide (MgO), aluminum oxide (AlO), titanium oxide (TiO), germanium oxide (GeO), strontium titanate (SrTiO$_3$), or any other suitable materials. A free magnetic layer may comprise a magnetic material such as iron, or a magnetic material including at least one of cobalt or iron or nickel, or any combination thereof. It is to be understood that while FIG. 5 generically depicts the MTJ layer stack 155, the number and arrangement of magnetic, metallic, and insulation layers that form the MTJ layer stack 155 will vary depending on the target MTJ architecture for MRAM devices to be formed in the BEOL layer.

The lithographic stack 200 is utilized to pattern the upper electrode layer 160, the MTJ layer stack 155, and the bottom electrode layer 150, using a process flow as described in further detail below. In some exemplary embodiments, the hardmask layer 202 is formed by depositing a layer of hardmask material (e.g., silicon nitride, silicon oxide, etc.) over the upper electrode layer 160. The planarizing layer 204 may comprise an organic planarizing layer (OPL) (e.g., organic polymer) or an organic dielectric layer (ODL), spin-on-carbon (SOC) layer or any other type of material which is self-leveling and achieves planarization over the surface topography without the use of etching, chemical mechanical polishing, or other conventional planarization techniques. In one exemplary embodiment, the planarizing layer 204 comprises an organic planarization material, which is a self-planarizing organic material that includes carbon, hydrogen, oxygen, and optionally nitrogen, fluorine, and silicon. The self-planarizing organic material can be a polymer with sufficiently low viscosity so that the top surface of the applied polymer forms a planar horizontal surface. The planarizing layer 204 is formed by spin-coating, and has a thickness in a range of about 50 nm to about 500 nm.

The ARC layer 206 is utilized to reduce reflection of light from a layer to be etched during exposure of a photoresist layer formed over the ARC layer 206, which is patterned to form the photoresist pattern 208. The ARC layer 206 may comprise an organic or inorganic anti-reflection coating. In one exemplary embodiment, the ARC layer 206 comprises a silicon ARC (Si-ARC) layer. The photoresist pattern 208 is formed by depositing (e.g., spin coating) a layer of photoresist material over the ARC layer 206, and then exposing and developing the layer of photoresist material to form the photoresist pattern 208168. In some embodiments, the thickness of the photoresist layer is in a range of about 20 nm to about 800 nm, although lesser and greater thicknesses can also be employed. The photoresist layer can be a layer of a photoresist material that is sensitive to deep-ultraviolet (DUV) radiation, extreme ultraviolet (EUV), or mid-ultraviolet (MUV) radiation as known in the art, or the photoresist layer can be an e-beam resist material that is sensitive to radiation of energized electrons.

Figure 6:
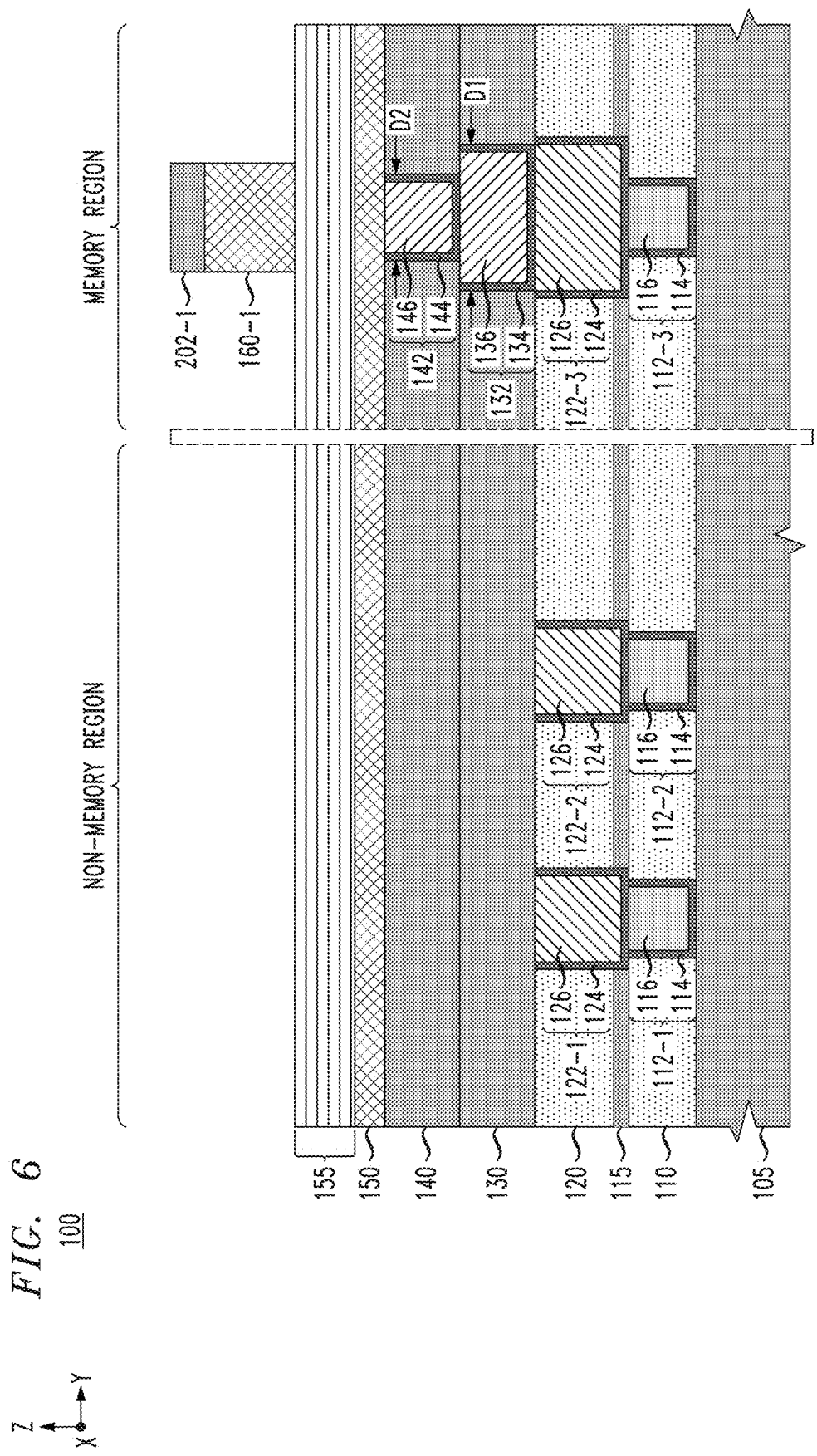
Figure 7:
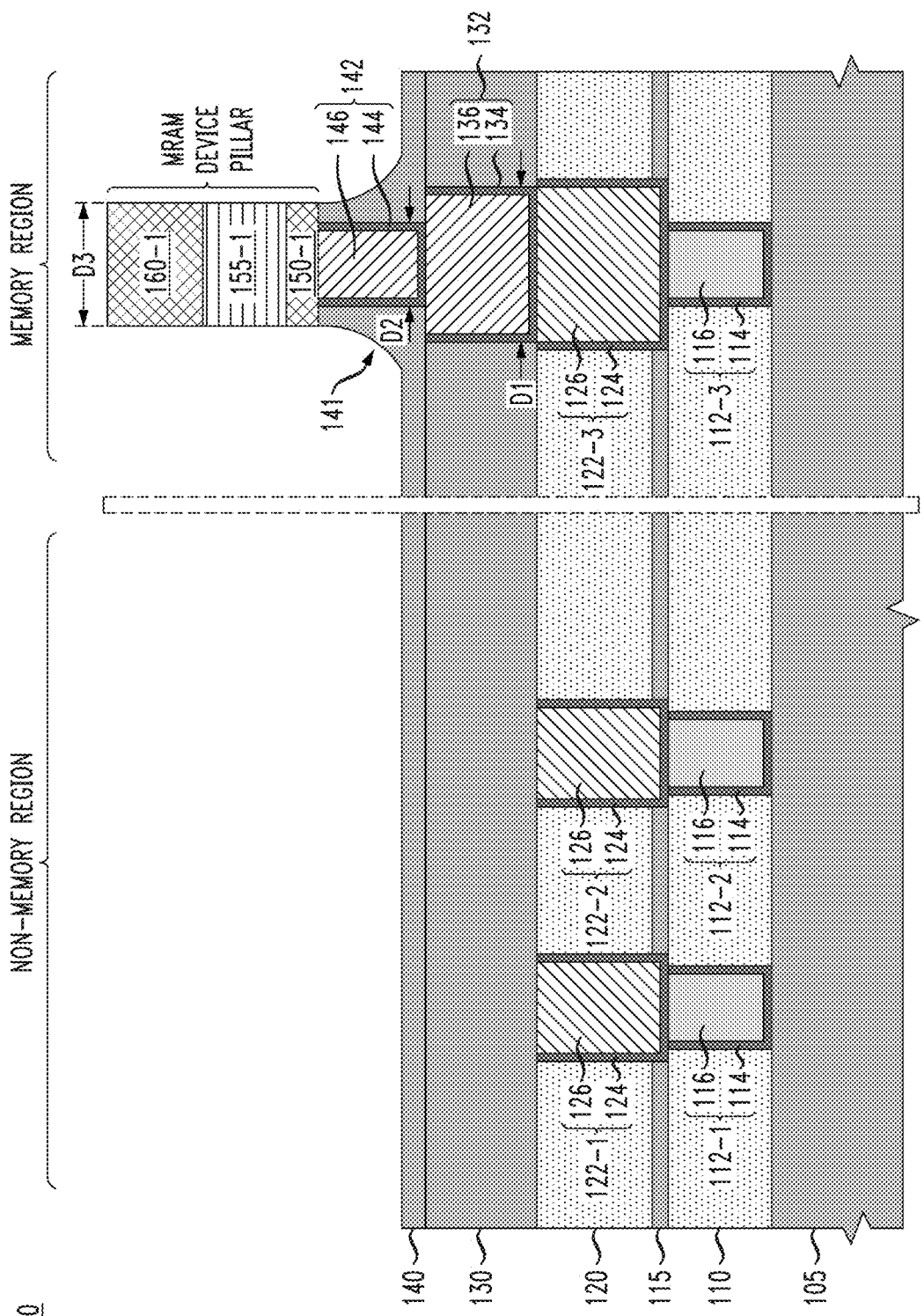

The photoresist pattern 208 as shown in FIG. 5 comprises an image that is transferred into the upper electrode layer 160, the MTJ layer stack 155, and the bottom electrode layer 150 using a sequence of etch processes as schematically illustrated in FIGS. 6 and 7, resulting in the formation of an MRAM device pillar. For example, FIG. 6 is a schematic cross-sectional side view of the device shown in FIG. 5 after performing dry etch processes to pattern the hardmask layer 202 and the upper electrode layer 160 to form a hardmask capping layer 202-1 and the upper electrode 160-1. More specifically, in one exemplary embodiment, the etch process begins with a directional reactive ion etch (RIE) process to etch down the exposed portions of the ARC layer 206, the planarizing layer 204, the hardmask layer 202, and the upper electrode layer 160, and stopping on the MTJ layer stack 155. During the RIE process, the photomask 208 and the ARC layer 206 are fully consumed, and the planarizing layer 204 is fully or partially consumed. The initial etch process results in transferring the image of the photomask 208 into the hardmask layer 202 and the upper electrode layer 160 to thereby form the upper electrode 160-1 and hardmask capping layer 202-1. Following the initial etch process, any remaining portion of the patterned planarizing layer 204 on top of the hardmask capping layer 202-1 is removed by an ashing process, resulting in the intermediate device structure shown in FIG. 2.

Next, FIG. 7 is a schematic cross-sectional side view of the device shown in FIG. 6 after patterning the exposed portion of the MTJ layer stack 155 and the bottom electrode layer 150 to form the MTJ structure 155-1 and the bottom electrode 150-1. The patterning results in the formation of the MRAM device pillar comprising the upper electrode 160-1, the MTJ structure 155-1, and the bottom electrode 150-1. The MRAM device pillar has a diameter D3, which is greater than the diameter D2 of the second bottom electrode via contact 142. The diameter D3 of the MRAM device pillar can be in a range of about 50 nm to about 150 nm.

In one exemplary embodiment, the MTJ layer stack 155 and bottom electrode layer 150 are patterned by performing an ion beam etch (IBE) process (or Milling process) to etch the exposed portion of the MTJ layer stack 155 and the bottom electrode layer 150 down to the fourth insulation layer 140. The IBE process is a dry plasma etch method which utilizes a remote broad beam ion/plasma source to etch the target materials by means of a physical inert gas and/or a chemical reactive gas. The ion bombardment of the substrate is well defined and controlled, wherein the IBE process measures and controls various material etch parameters, such as ion energy, ion current density, and ion incidence angle. The ion incidence angle is achieved by tilting the substrate stage to a target angle, and the etching of the substrate is achieved by rotating the tilted substrate stage. In some exemplary embodiments, IBE process to etch the MTJ layer stack 155 and bottom electrode layer 150 is performed at an angle in a range of about 30° to about 60°.

In some embodiments, the IBE process to etch the MTJ layer stack 155 and bottom electrode layer 150 is a non-selective etch process such that the IBE process results in the removal of the hardmask capping layer 202-1 and as well as a slight etching (recessing) of the upper electrode 160-1. Moreover, while it would be ideal to terminate the IBE process when reaching the fourth insulation layer 140, an over-etch is performed to ensure that the exposed portion of the bottom electrode layer 150 is completely removed to properly form the bottom electrode 150-1 of the MRAM device pillar, which results in recessing/gouging of the upper surface of the fourth insulation layer 140, as schematically illustrated in FIG. 4.

The IBE process results in the formation of residual material (e.g., metallic and dielectric material) on the sidewalls of the MTJ structure 155-1 as a result of the re-deposition of metallic and dielectric material during the ion beam etching of the material layers of the MTJ layer stack 155, the upper electrode 160-1, the bottom electrode layer 150 and the fourth insulation layer 140. The residual metallic material on the sidewalls of the MTJ structure 155-1 can cause shorts between the metallic layers of the MTJ structure 155-1. Accordingly, a cleaning etch process is performed to remove the residual material from the sidewalls of the MTJ structure 155-1. In some embodiments, the cleaning etch process is performed using an IBE process which is configured to selectively remove the residual dielectric/metallic material from the sidewalls of the MTJ structure 155-1 while preventing or minimizing recessing/etching of the upper electrode 150-1.

In one embodiment, selective removal of the residual material is performed using an IBE clean-up process which is configured with a lower ion energy (e.g., voltage) and increased ion incidence angle of about 60° and or greater (as compared to the initial IBE process parameters for etching the MTJ layer stack 155 and bottom electrode layer 150). The IBE clean-up process removes the residual dielectric and metallic material from the sidewalls of the MTJ structure 155-1 and the sidewalls of the upper electrode 160-1. However, the IBE clean-up process results in a further etching/gouging of the expose surface of the fourth insulation layer 140.

As schematically illustrated in FIG. 7, the initial IBE etch process and subsequent IBE cleaning etch process can result in removing a significant amount of the fourth insulation layer 140. However, the gouging/recessing of the fourth insulation layer 140 is not a concern in the exemplary fabrication process flow because (i) the fourth insulation layer 140 essentially serves as a sacrificial dielectric layer for the IBE etch and cleaning processes and (ii) the underlying metallic structures 122-1 and 122-2 in the non-memory area remain covered by a relatively thick layer of dielectric material (e.g., the third insulation layer 130 and the remaining portion of the fourth insulation layer 140) following the initial IBE etch process.

Furthermore, since the MRAM device pillar is formed with a diameter D3 which is greater than the diameter D2 of the underlying second bottom electrode via contact 142, the etching of the MRAM stack layers (e.g., layers 160, 155 and 150) and recessing/gouging of the fourth insulation layer 140 does not result in etching or damage to the second bottom electrode via contact 142. In addition, while the IBE etch and cleaning processes result in recessing/gouging of the fourth insulation layer 140, in practice, the etching process results in the formation of flared or tapered sidewalls 141 of the fourth insulation layer 140 at the bottom of the MRAM device pillar. In this regard, in instances where the IBE etch and cleaning processes result in a slight recessing/gouging of the third insulation layer 130, the upper portion of the first bottom electrode via contact 132 will be protected from the IBE etch processes as a result of the tapered profiles 141 that are naturally formed in the fourth insulation layer 140 at the bottom of the MRAM device pillar as a result of the IBE etch processes.

Figure 8:
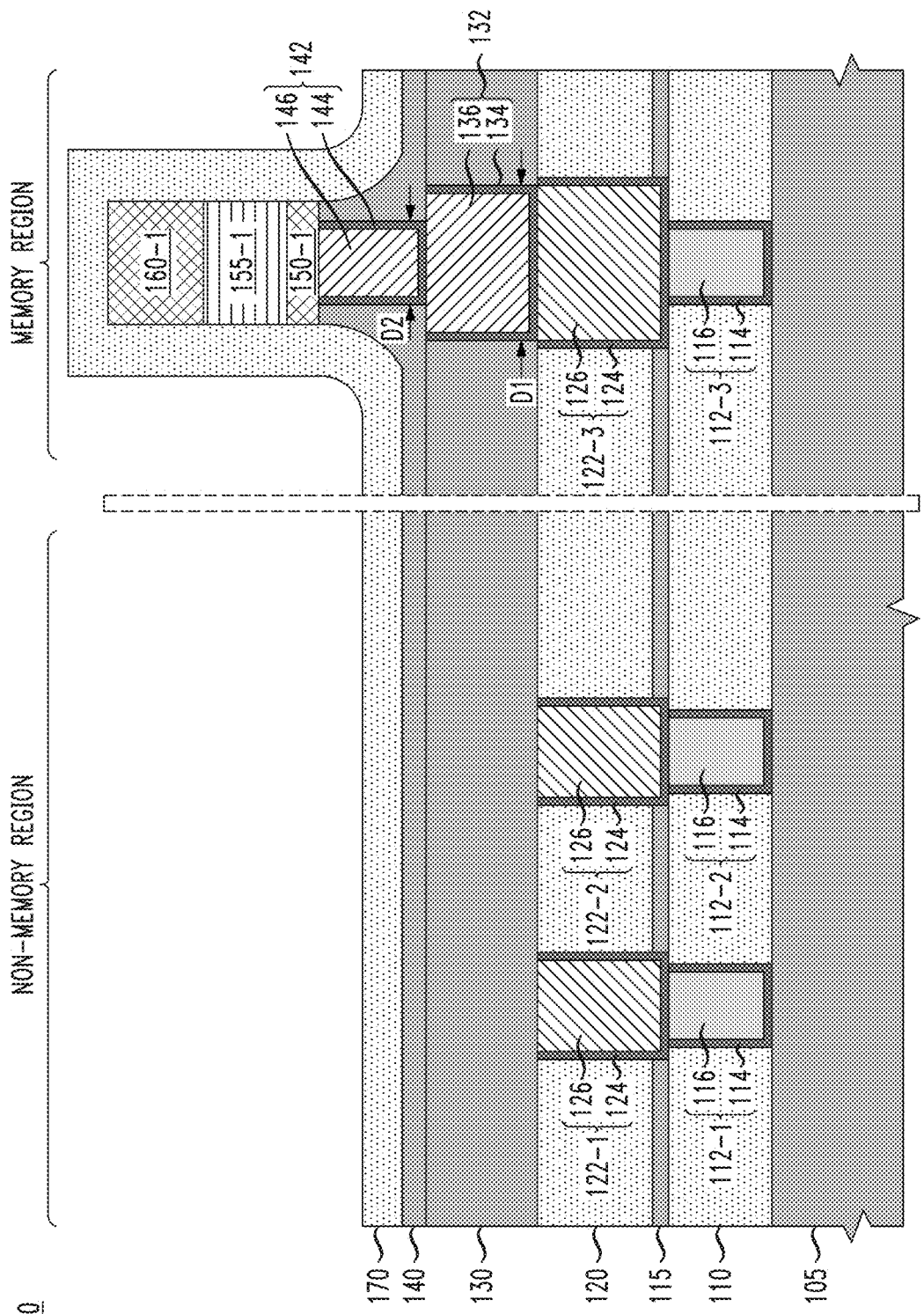

Next, FIG. 8 is a schematic cross-sectional side view of the device shown in FIG. 7 after forming a conformal dielectric layer 170 (or conformal encapsulating layer 170) to encapsulate the MRAM devices in the memory region. In some embodiments, the conformal dielectric layer 170 comprises a dielectric material such as SiN, SiC, SiCN, SiCH, or any dielectric material which is suitable for use as dielectric sidewall spacers for the MRAM devices. In some embodiments, the conformal dielectric layer 170 is formed by conformally depositing dielectric material using plasma-enhanced chemical vapor deposition (PECVD), atomic layer deposition (ALD), or other suitable deposition methods which enable the deposition of thin films of dielectric material with high conformality.

Figure 9:
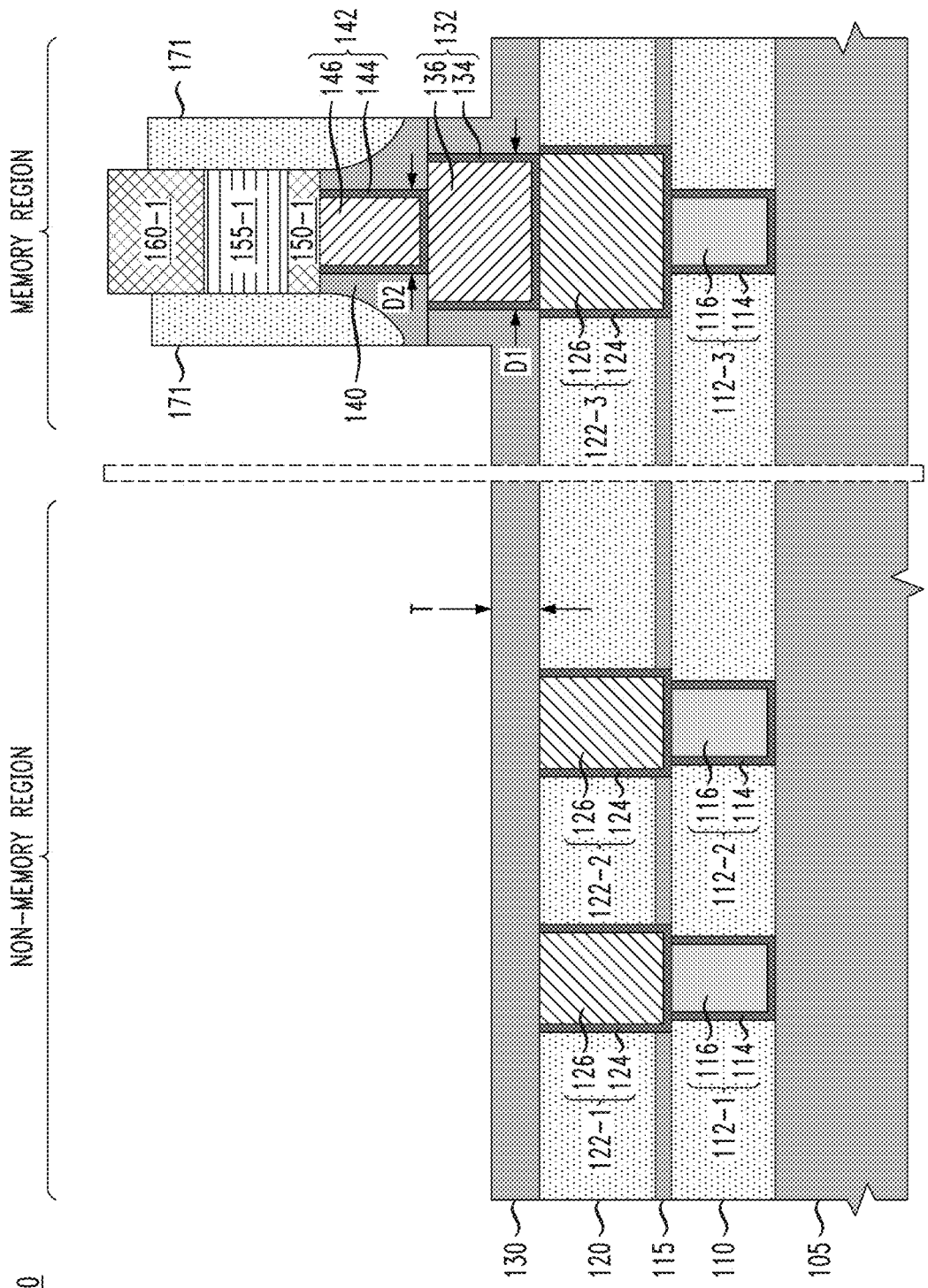

Following formation of the conformal dielectric layer 170, an etch process is performed to pattern the conformal dielectric layer 170 to thereby form sidewall spacers for the MRAM devices in the memory region. More specifically, FIG. 9 is a schematic cross-sectional side view of the device shown in FIG. 8 after patterning the conformal dielectric layer 170 to form the dielectric sidewall spacers 171 on sidewalls of the MRAM device. In this exemplary embodiment, the interface between the dielectric sidewall spacer 171 and the MTJ structure 155-1 and the upper and lower electrodes 160-1 and 150-1 is completely or substantially free of metallic residue as a result of the cleaning etch process.

In some embodiments, the patterning process is performed using a dry etch process (e.g., RIE) to etch down lateral surfaces of the conformal dielectric layer 170 on the upper electrode 150-1 and on the surface of the fourth insulation layer 140. In some embodiments, an over etch process is performed to ensure that upper surface of the upper electrode 150-1 is exposed. As schematically illustrated in FIG. 9, the over etching of the conformal dielectric layer 170 results in vertical recessing of the dielectric sidewall spacer 171 on the sidewalls of the MRAM device pillar, as well as removing the remaining portion of the fourth insulation layer 140 in the non-memory region and a slight recessing of the third insulation layer 130 in the non-memory region.

Irrespective of the over-etching that is performed during (i) the IBE patterning and cleaning etch processes that are performed to fabricate the MRAM device pillar, and (ii) the patterning of the conformal dielectric layer 170, it is to be appreciated that a sufficient thickness T of the third insulation layer 130 remains in the non-memory area to serve as a protective capping layer for the metallic structures 122 (wiring, vias, etc.) in the non-memory area of the BEOL. In some embodiments, the remaining thickness T of the third insulation layer 130 in the non-memory area is in a range of about 50 nm to about 100 nm.

In this regard, the fabrication and implementation of multi-level bottom electrode via contacts formed in multiple layers of dielectric material (e.g., third and fourth insulation layers 130 and 140), advantageously allows for sacrificial etching of the dielectric layers during formation of the MRAM devices (e.g. etch patterning and etch cleaning steps) while retaining a sufficient thickness of a remaining dielectric material to serve as a protective capping layer to protect metallic wiring and other metallization disposed in an underlying metallization layer. For nanoscale dimensions, it would not be possible to form a single bottom electrode via contact in a single, thick layer of dielectric material as the requisite critical dimension (CD) of the bottom electrode via contact (e.g., diameter D1, less than diameter D3 of the MRAM device pillar) would result in the formation of relatively high aspect ratio via openings in the thick layer of dielectric material, which would prevent proper filling of metallic material in the high aspect ratio via openings to form the relatively tall, single bottom electrode via contact.

Figure 10:
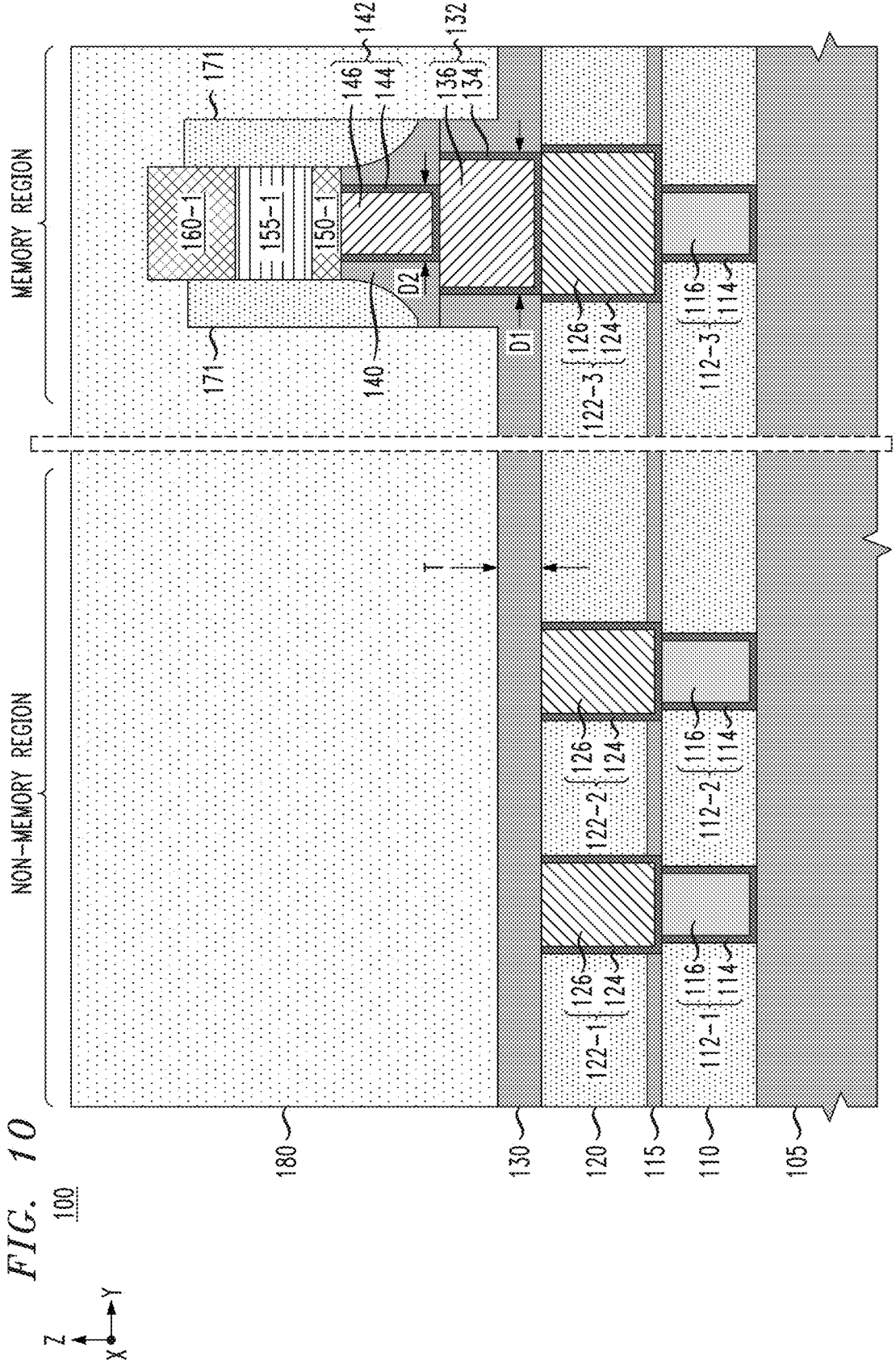

A next stage of the fabrication process comprises forming an ILD layer to encapsulate the MRAM device in the memory region and form upper electrode via contacts to the MRAM devices. For example, FIG. 10 is a schematic cross-sectional side view of the device shown in FIG. 9 after forming the fifth insulation layer 180 (e.g., ILD layer) to encapsulate the MRAM devices. In some embodiments, the fifth insulation layer 180 is formed by a process which comprises depositing a layer of insulating material over the substrate surface to cover the non-memory region and the MRAM devices in the memory region, and then planarizing the deposited layer of insulating material to form the fifth insulation layer 180, as shown in FIG. 10. The fifth insulation layer 180 can be formed using the same or similar materials and deposition methods as the first insulation layer 110 and/or the second insulation layer 120, as discussed above.

Following the formation of the fifth insulation layer 180, the process flow continues with forming the metallic interconnect structure 182-1 and the upper electrode via contact 182-2 in the fifth insulation layer 180, resulting in the structure shown in FIG. 1. The metallic interconnect structure 182-1 (e.g., wire and via structure) comprises a liner layer 184-1 and a metallic material 186-1 which can be formed using a dual damascene process to form a copper interconnect, using known methods and materials. The upper electrode via contact 182-2 is formed in contact with the upper electrode 160-1 of the MRAM device. The upper electrode via contact 182-2 comprises a liner layer 184-2 and a metallic via 186-2. The metallic via 186-2 can be formed of conductive material such as Cu, Ta, TaN, Ti, TiN, Ru, W, etc., or other types of metallic material which is suitable for the given application. The liner layers 184-1 and 184-2 can be formed using one more layers of material that serve as a diffusion barrier layer and/or seed layer, such as TiN, TaN, Co, etc.

The upper electrode via contact 182-2 is formed using process which comprises, e.g., patterning the fifth insulation layer 180 to etch openings that exposes the underlying upper electrode 160-1, depositing a conformal liner layer and metallic fill material to line and fill the etched openings, and then performing a CMP process to remove the overburden portions of the liner layer and metallic fill material down to the surface of the fifth insulation layer 180. Depending on the materials used, the metallic interconnects 182-1 and 182-2 can be formed concurrently, or in separate steps. Thereafter, further BEOL processing is performed to build one or more additional metal levels above the MRAM device layer to complete fabrication of the BEOL structure.

It is to be understood that the methods discussed herein for fabricating embedded MRAM devices can be readily incorporated within semiconductor processing flows for fabricating various type of semiconductor IC devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for fabricating a semiconductor integrated circuit device, comprising:
    forming a first insulation layer over a metallization layer of a substrate, wherein the first insulation layer comprises a first bottom electrode via contact formed in the first insulation layer;
    forming a second insulation layer over the first insulation layer, wherein the second insulation layer comprises a second bottom electrode via contact formed in the second insulation layer, wherein the second bottom electrode via contact is disposed over, and in contact with, the first bottom electrode via contact;
    forming a stack of layers over the second insulation layer, the stack of layers comprising (i) a bottom electrode layer formed over the second insulation layer, (ii) a magnetic tunnel junction layer stack formed over the bottom electrode layer, and (iii) an upper electrode layer formed over the magnetic tunnel junction layer stack;
    etching the stack of layers to form a memory device pillar comprising a bottom electrode, a magnetic tunnel junction structure, and an upper electrode, wherein the bottom electrode is disposed over, and in contact with, the second bottom electrode via contact, and wherein etching the stack of layers results in recessing an exposed portion of the second insulation layer; and
    depositing and etching a conformal layer of dielectric material to thereby form a dielectric spacer on sidewalls of the memory device pillar, wherein etching the conformal layer of dielectric material results in further recessing the exposed portion of the second insulation layer down to the first insulation layer;
    wherein a remaining portion of the first insulation layer serves as a capping layer for the metallization layer.

2. The method of claim 1, wherein etching the conformal layer of dielectric material results in partially recessing an exposed portion of the first insulation layer, wherein the partially recessed first insulation layer serves as the capping layer for the metallization layer.

3. The method of claim 1, wherein the first bottom electrode via contact comprises a first diameter, wherein the second bottom electrode via contact comprises a second diameter, wherein the memory device pillar comprises a third diameter, and wherein the third diameter is greater than the second diameter.

4. The method of claim 3, wherein the first diameter is greater than the second diameter.

5. The method of claim 1, wherein etching the stack of layers to form the memory device pillar comprises:
    forming a lithographic stack over the upper electrode layer, wherein the lithographic stack comprises a hardmask layer formed over the upper electrode layer;
    lithographically patterning the lithographic stack to form an etch mask;
    performing a first etch process to pattern the upper electrode layer by transferring an image of the etch mask into the upper electrode layer, wherein the first etch process results in the formation of the upper electrode with a hardmask capping layer disposed over the upper electrode; and
    performing a second etch process to transfer an image of the upper electrode and the hardmask capping layer into the magnetic tunnel junction layer stack and bottom electrode layer to form the magnetic tunnel junction structure and the bottom electrode of the memory device pillar;
    wherein the hardmask capping is removed as a result of the second etch process; and
    wherein the second etch process results in said recessing of the exposed portion of the second insulation layer.

6. The method of claim 5, wherein the second etch process comprises an ion beam etch process that is performed with an ion incidence angle in a range of about 30° to about 60°.

7. The method of claim 5, further comprising performing a cleaning etch process to remove residual material which is redeposited on sidewalls of the magnetic tunnel junction structure and the upper and bottom electrodes, as a result of the second etch process, wherein the cleaning etch process results in further recessing of the exposed portion of the second insulation layer.

8. The method of claim 7, wherein the cleaning etch process comprises an ion beam etch process that is performed with an ion incidence angle of about 60° or greater to etch away the residual material.

9. The method of claim 1, wherein the first insulation layer comprises one of silicon nitride, silicon carbide, silicon carbon nitride, and silicon carbon hydrogen, wherein the first insulation layer is formed with a thickness in a range of about 50 nanometers (nm) to about 150 nm.

10. The method of claim 1, wherein the second insulation layer comprises one of silicon nitride, silicon carbide, silicon carbon nitride, and silicon carbon hydrogen, wherein the first insulation layer is formed with a thickness in a range of about 50 nanometers (nm) to about 150 nm.

11. The method of claim 1, wherein the conformal layer of dielectric material comprises one of silicon nitride, silicon carbide, silicon carbon nitride, and silicon carbon hydrogen.

12. A method for fabricating a semiconductor integrated circuit device, comprising:
- forming a metallization layer of a back-end-of-line structure, wherein the metallization layer comprises a first interlayer dielectric layer and a plurality of metallic structures formed in the first interlayer dielectric layer in a memory region and a non-memory region of the back-end-of line structure;
- forming a first insulation layer over the metallization layer, wherein the first insulation layer comprises a first bottom electrode via contact formed in the first insulation layer in the memory region;
- forming a second insulation layer over the first insulation layer, the second insulation layer comprising a second bottom electrode via contact formed in the second insulation layer in the memory region, wherein the second bottom electrode via contact is disposed over, and in contact with, the first bottom electrode via contact;
- forming a stack of layers over the second insulation layer, the stack of layers comprising (i) a bottom electrode layer formed over the second insulation layer, (ii) a magnetic tunnel junction layer stack formed over the bottom electrode layer, and (iii) an upper electrode layer formed over the magnetic tunnel junction layer stack;
- etching the stack of layers to form a memory device pillar comprising a bottom electrode, a magnetic tunnel junction structure, and an upper electrode, wherein the bottom electrode is disposed over, and in contact with, the second bottom electrode via contact, and wherein etching the stack of layers results in recessing an exposed portion of the second insulation layer; and
- depositing and etching a conformal layer of dielectric material to thereby form a dielectric spacer on sidewalls of the memory device pillar;
- wherein etching the conformal layer of dielectric material results in further recessing the exposed portion of the second insulation layer down to the first insulation layer, and partially recessing an exposed portion of the first insulation layer;
- wherein the partially recessed first insulation layer serves as a capping layer for the metallization layer; and
- forming a second interlayer dielectric layer to cover the partially recessed first insulation layer and the memory device pillar in the non-memory and memory regions of the back-end-of-line structure; and
- forming a plurality of metallic interconnect structures in the second interlayer dielectric layer, wherein the plurality of metallic interconnect structures comprise an upper electrode via contact which is formed in contact with the upper electrode of the memory device pillar in the memory region of the back-end-of-line structure.

13. The method of claim 12, wherein the metallization layer comprises an initial metallization level of the back-end-of-line structure, which is formed on a middle-of-line layer of the semiconductor integrated circuit device.

14. The method of claim 12, wherein the first bottom electrode via contact comprises a first diameter, wherein the second bottom electrode via contact comprises a second diameter, wherein the memory device pillar comprises a third diameter, wherein the third diameter is greater than the second diameter; and wherein the first diameter is greater than the second diameter.

15. The method of claim 12, wherein etching the stack of layers to form the memory device pillar comprises:
- forming a lithographic stack over the upper electrode layer, wherein the lithographic stack comprises a hardmask layer formed over the upper electrode layer;
- lithographically patterning the lithographic stack to form an etch mask;
- performing a first etch process to pattern the upper electrode layer by transferring an image of the etch mask into the upper electrode layer, wherein the first etch process results in the formation of the upper electrode with a hardmask capping layer disposed over the upper electrode;
- performing a second etch process to transfer an image of the upper electrode and the hardmask capping layer into the magnetic tunnel junction layer stack and bottom electrode layer to form the magnetic tunnel junction structure and the bottom electrode of the memory device pillar, wherein the hardmask capping is removed as a result of the second etch process, and wherein the second etch process results in said recessing of the exposed portion of the second insulation layer; and
- performing a cleaning etch process to remove residual material which is redeposited on sidewalls of the magnetic tunnel junction structure and the upper and bottom electrodes, as a result of the second etch process, wherein the cleaning etch process results in further recessing of the exposed portion of the second insulation layer.

16. The method of claim 12, wherein:
- the first insulation layer comprises one of silicon nitride, silicon carbide, silicon carbon nitride, and silicon carbon hydrogen, wherein the first insulation layer is formed with a thickness in a range of about 50 nanometers (nm) to about 150 nm;
- the second insulation layer comprises one of silicon nitride, silicon carbide, silicon carbon nitride, and silicon carbon hydrogen, wherein the first insulation layer is formed with a thickness in a range of about 50 nm to about 150 nm; and
- the conformal layer of dielectric material comprises one of silicon nitride, silicon carbide, silicon carbon nitride, and silicon carbon hydrogen.

* * * * *